United States Patent [19]

Fox

[11] 4,216,502
[45] Aug. 5, 1980

[54] PEAK DETECTOR CIRCUIT
[75] Inventor: Edward C. Fox, Cranbury, N.J.
[73] Assignee: RCA Corporation, New York, N.Y.
[21] Appl. No.: 934,834
[22] Filed: Aug. 18, 1978
[51] Int. Cl.$^2$ ............................................. H04N 5/52
[52] U.S. Cl. .................................... 358/176; 358/160; 307/350
[58] Field of Search ............... 358/160, 174, 176, 178; 307/350, 352

[56] References Cited

U.S. PATENT DOCUMENTS

| | | | |
|---|---|---|---|
| 3,624,290 | 11/1971 | Hofmann | 358/178 |
| 3,835,248 | 9/1974 | Harford | 358/178 |

OTHER PUBLICATIONS

CA3120e, TV "Jungle" Circuits, RCA Linear Integrated Circuits Databook, pp. 355–358, 1977.

Primary Examiner—Richard Murray
Attorney, Agent, or Firm—E. M. Whitacre; W. H. Meagher; W. B. Yorks, Jr.

[57] ABSTRACT

A peak detector circuit is provided for detecting the maximum excursions of an amplitude varying signal. The circuit includes a network comprising a capacitor serially coupled to a charging impedance and having a time constant suitable for responding to the maximum excursions of the amplitude varying signal. A semiconductor means has an input terminal for receiving the amplitude varying signal and an output terminal coupled to the charging impedance for charging the capacitor toward the maximum excursions of the amplitude varying signal. The semiconductor means exhibits an impedance which is subject to increase with a decrease in current drawn therethrough. A controllable current sink is responsive to the amplitude varying signal at the input terminal of the semiconductor means and is coupled to the output terminal of the semiconductor means for drawing a component of current through the semiconductor means during the charging of the capacitor which is supplemental to the capacitor charging current drawn therethrough. The supplemental current component is of a sufficient magnitude to preclude increase of the impedance exhibited by the semiconductor means during the charging of the capacitor beyond a value which is substantially less than the charging impedance.

7 Claims, 4 Drawing Figures

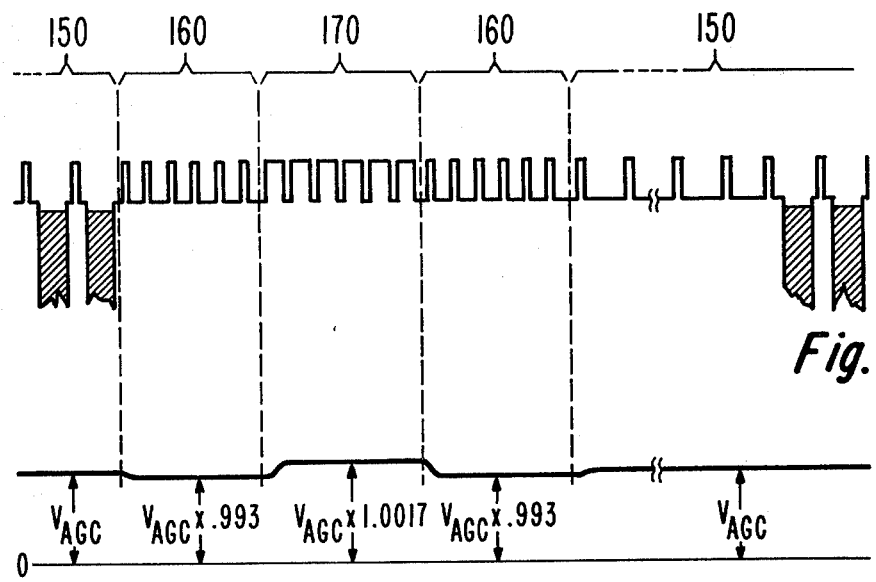
*Fig. 1(a).*
*Fig. 1(b).*
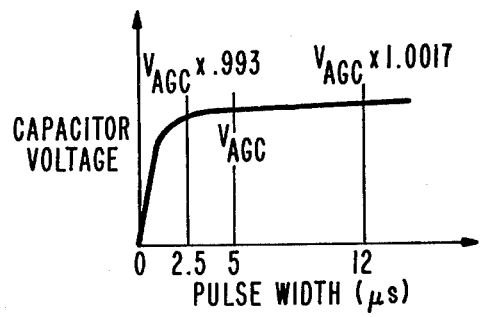
*Fig. 2.*

PEAK DETECTOR CIRCUIT

This invention relates to a peak detector including a capacitor and a charging rectifier in which the impedance of the charging rectifier is limited to a low level, and which may be advantageously used to develop an automatic gain control voltage in a television receiver.

Automatic gain control (AGC) circuits are commonly used in television receivers to derive a suitable control voltage for application to the radio frequency (RF) and intermediate frequency (IF) amplifier stages of the receiver. The control voltage is effective to vary the gain of these stages inversely in accordance with the level of the synchronizing pulse components of a detected video signal so as to provide a constant peak amplitude detected television signal.

It is customary in television receivers to derive the AGC control voltage by sampling the peak level of the synchronizing pulse components of the composite video signal and adjusting the control voltage in response to changes in the signal level. A peak detector may be utilized to sample the sync pulses, but because it is quite susceptible to impulse noise, means are generally provided to gate "on", or key, the AGC circuit only during the relatively short horizontal retrace (flyback) pulses produced by the horizontal deflection system.

The peak detector usually includes a capacitor which is charged toward the peak level of the video signal during the keying interval by a charging circuit. The capacitor is charged to the signal peak at an exponential rate. If the capacitor is initially discharged, the capacitor is at first charged by a significant flow of current from the charging circuit. As the capacitor is charged toward the signal peak, the current supplied by the charging circuit decreases, causing an increase in the charging time constant of the peak detector. The increasing charging time constant results from the increasing output impedance of the charging circuit as the charging current decreases. When a signal of short duration is being sampled, such as a 2.5 microsecond equalizing pulse, it is possible that the increasing charging time constant will result in the charging of the capacitor to a level which is below the peak signal level. The peak detector will thus perceive a lower signal level when sampling equalizing pulses than that which results from sampling 5 microsecond horizontal sync pulses or 27 microsecond vertical sync pulses during the keying interval, even though the signal levels of all the pulses are identical. This difference in perceived signal level will cause the peak detected signal level to be a function of sync pulse width and amplitude, instead of solely pulse amplitude. The AGC system will respond to the variation in detected signal level by increasing the gain of the RF and IF amplifiers slightly during the equalizing pulse intervals and decreasing the gain during vertical sync intervals, thereby causing fluctuations in system gain at the vertical scanning rate. These fluctuations can excite low frequency resonances in the AGC system loop which can result in loss of vertical sync and picture roll.

In accordance with the principles of the present invention, a peak detector circuit is provided for detecting the maximum excursions of an amplitude varying signal. The circuit includes a network comprising a capacitor serially coupled to a charging impedance and having a time constant suitable for responding to the maximum excursions of the amplitude varying signal. A semiconductor means has an input terminal for receiving the amplitude varying signal and an output terminal coupled to the charging impedance for charging the capacitor toward the maximum excursions of the amplitude varying signal. The semiconductor means exhibits an impedance which is subject to increase with a decrease in current drawn therethrough. A controllable current sink is responsive to the amplitude varying signal at the input terminal of the semiconductor means and is coupled to the output terminal of the semiconductor means for drawing a component of current through the semiconductor means during the charging of the capacitor which is supplemental to the capacitor charging current drawn therethrough. The supplemental current component is of a sufficient magnitude to preclude increase of the impedance exhibited by the semiconductor means during the charging of the capacitor beyond a value which is substantially less than the charging impedance. The controllable current sink conducts no current when the semiconductor means is not charging the capacitor.

The peak detector may be advantageously used in an automatic gain control circuit to detect the peaks of synchronizing signal components of a composite video signal.

In the accompanying drawings:

FIG. 1(a) illustrates a typical composite video signal;

FIG. 1(b) illustrates an AGC control voltage level which varies as a function of the widths of the sync pulses of FIG. 1(a);

FIG. 2 illustrates voltage variations of a peak detecting capacitor as a function of sync pulse width.

Figure 3:
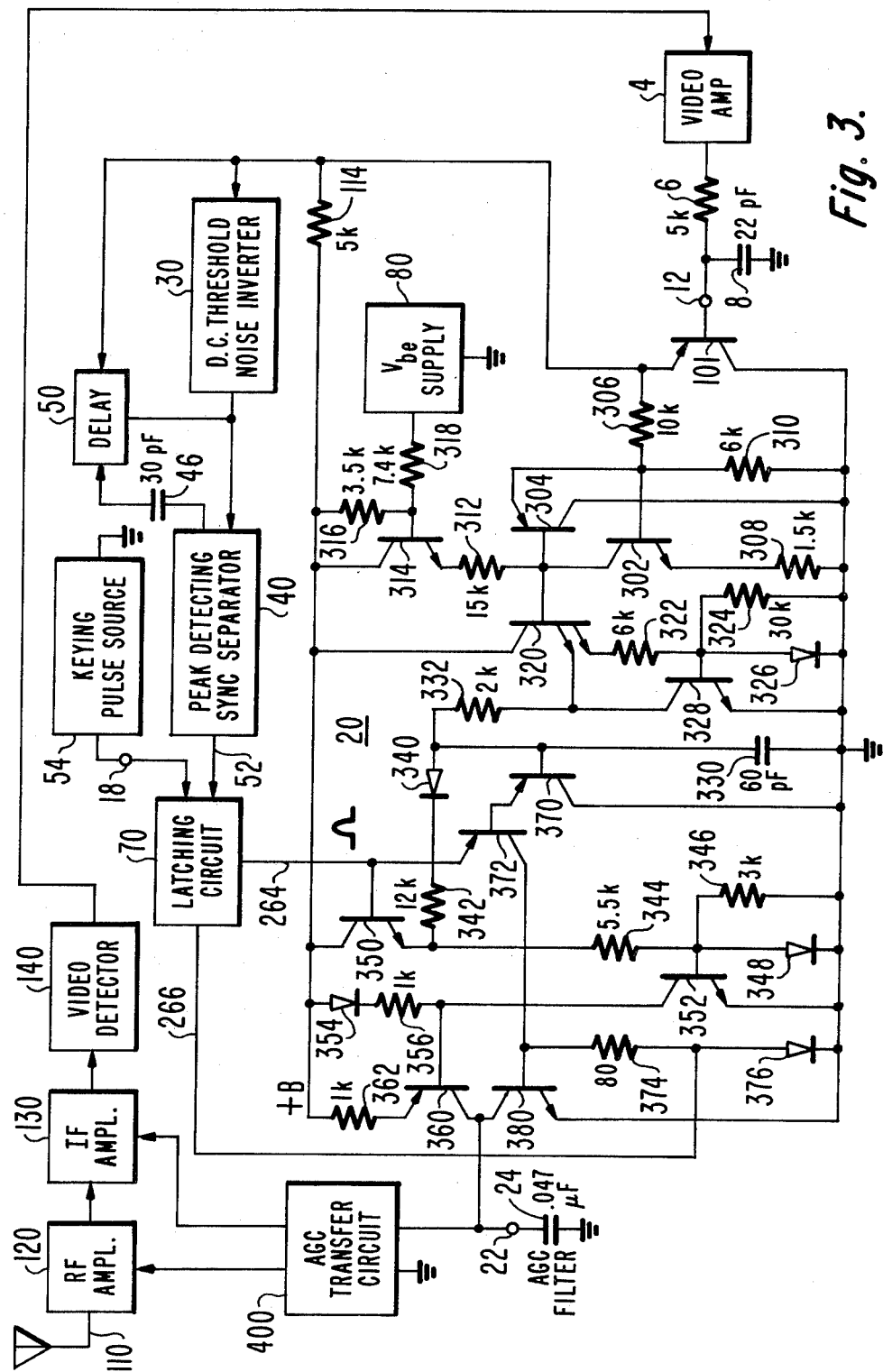
FIG. 3 illustrates, partially in schematic diagram form and partially in block diagram form, a peak detecting AGC system constructed in accordance with the principles of the present invention.

In simplified form, a peak detector which samples and stores the peak value of a signal comprises a semiconductor diode junction and a capacitor. The signal is coupled to the anode electrode of the diode, is rectified by the p-n junction, and applied across the capacitor which is connected at the cathode electrode. As the signal increases to its peak level, the diode conducts signal current to the capacitor, charging it to the peak level of the signal, less the voltage drop across the diode junction. When the signal decreases to a lower level, the charged capacitor retains a voltage representing the peak signal level, which reverse biases the diode junction. If the diode and the capacitor have no current leakage and no other discharging means is connected to the capacitor, the capacitor will retain the peak signal level indefinitely.

The peak detector previously described may be incorporated in an AGC circuit to detect the peak level of the synchronizing signal components of a composite video signal. An AGC control voltage is developed across the capacitor and applied to the RF and IF amplifying stages of the television receiver to control the gain of these stages. Alternatively, the signal level stored across the capacitor may be transferred to a separate AGC filter capacitor by a translating network and then coupled to the amplifying stages. In certain AGC circuit configurations, such as that described in copending U.S. patent application Ser. No. 934823, entitled "Keyed AGC Circuit," by J. R. Harford, it may be desirable to discharge the peak detecting capacitor between sync pulses, and permit the peak detector to sample the sync pulses only for a specific keying interval, during which time the peak detected level is transferred to a separate AGC filter capacitor. The following example assumes that a peak detector is utilized in an AGC circuit of this type, having a 12 microsecond keying interval.

Peak detection of the synchronizing signal components of a composite video signal occurs as follows.

Referring to FIG. 1(a), the vertical synchronization interval of a composite video signal is illustrated. The waveform there shown contains horizontal sync pulse intervals 150, equalizing pulse intervals 160, and a vertical sync pulse interval 170. The sync pulses contained in these intervals have typical durations of approximately 2.5 microseconds for the equalizing pulses, 5 microseconds for the horizontal sync pulses, and 27 microseconds for the vertical sync pulses. The composite video signal is applied to the anode of the peak detector diode for peak detection of the sync pulses.

If the capacitor is discharged when the signal is applied to the anode electrode of the diode, it will begin to charge toward the signal peak at an initially high rate, due to the large voltage differential between the input signal and the low voltage level across the capacitor. But as the voltage across the capacitor approaches that of the input signal, the charging rate will decrease and the charging time constant of the peak detector will increase. The increasing charging time constant is due to the rising impedance at the cathode electrode of the diode (i.e., the current source) as the rate of charge decreases. Given a sufficiently long time to charge, the capacitor will eventually be charged to the signal peak. Stated another way, were it not for the high forward impedance of the diode at low levels of current conduction, the capacitor would charge to a level only one part in $10^9$ away from the peak signal level (less the voltage drop across the diode junction) in only a few microseconds. However, when the decreasing charging rate is taken into account, it is found that a substantial amount of time is required for the capacitor to reach a voltage level representative of the full peak value.

The effect of the exponential charging rate on the peak detecting capacitor is illustrated in FIG. 2. The graphical curve there shown indicates that during a 5 microsecond horizontal sync pulse, the capacitor will charge to a peak voltage level designated as $V_{AGC}$. (The voltage level achieved by peak detecting a horizontal sync pulse is used as a reference level, since horizontal sync pulses predominate numerically over equalizing and vertical sync pulses in a television field. An NTSC television field contains a vertical sync pulse with six serrations, 12 equalizing pulses and 253 or 254 horizontal sync pulses.) During a 2.5 microsecond equalizing pulse, the capacitor will charge to a voltage level which is 0.7% less than that achieved by a horizontal sync pulse, or $V_{AGC} \times 0.993$. And when the peak detector samples a 27 microsecond vertical sync pulse for the 12 microsecond keying interval, the capacitor will attain a voltage level which is 0.17% above that achieved by a horizontal sync pulse, or $V_{AGC} \times 1.0017$.

The AGC control voltage resulting from these differing voltage levels is illustrated in FIG. 1(b). The waveform there shown corresponds to the sync pulse intervals of FIG. 1(a). The waveform illustrates that the constant amplitude video signal of FIG. 1(a) will result in an AGC control voltage having an amplitude of $V_{AGC}$ during horizontal sync intervals 150, an amplitude of $V_{AGC} \times 0.993$ during equalizing pulse intervals 160, and an amplitude of $V_{AGC} \times 1.0017$ during vertical sync pulse intervals 170. Thus, the AGC control voltage is seen to have peak-to-peak amplitude variations of almost 1% during the vertical synchronizing interval for a constant amplitude video signal. Because of the time duration of the vertical sync and equalizing pulse intervals 170 and 160 (three horizontal lines each), this variation has a frequency of approximately 2600 Hz.

This 1% amplitude, 2600 Hz effective signal strength variation rate would be of no consequence if the AGC system (including the RF and IF amplifiers, video detector and amplifier, and AGC circuit), considered as a feedback loop for dynamically correcting signal strength variation, were a single time constant system and hence free of resonances. However, the AGC system typically contains several time constants, such as those in circuits which control AGC delay for the RF and IF amplifiers, and R-C networks which act to protect the tuner from kinescope arcing. These various time constants combine to produce numerous resonant poles in the root-locus plot of the transfer function of the AGC system. Moreover, the AGC system generally has a considerable amount of loop gain in order to be able to compensate for airplane flutter. Due to variations in the rate of gain change with changes in the AGC control voltage which are typical of IF and RF amplifiers, the amount of this loop gain can vary considerably; the tuner AGC loop gain alone may vary over a range of one hundred to one. The resonance of the AGC system varies as a function of the loop gain; the higher the gain, the higher the resonant frequencies. Thus, it often happens that resonances in the AGC system in the vicinity of 2600 Hz can arise, which are excited by the 2600 Hz variation in system gain caused by the varying AGC control voltage. When excited, these resonances will cause bursts of oscillations in the AGC system loop at a vertical rate and the picture may roll vertically.

Due to the complexity of the AGC system loop and the many variables involved, it is virtually impossible to calculate the existence and location of resonant poles in an AGC system prior to construction and testing. Often, the existence of these resonances will only become known at a much later date, when a specific set of circumstances occur which are effective to excite them into their degrading oscillation. Thus, the safest way to prevent resonances from adversely affecting the AGC system is to prevent the 2600 Hz variation in AGC signal strength which excites them into oscillation.

An AGC circuit containing a peak detector constructed in accordance with the principles of the present invention is illustrated partially in schematic diagram form and partially in block diagram form in FIG. 3. The AGC circuit there shown is essentially identical to that described in copending United States patent application Ser. No. 934823, entitled, "Keyed AGC Circuit," filed by J. R. Harford concurrently herewith.

Referring to FIG. 3, an antenna 110 receives a broadcast frequency television signal, which is supplied to an RF amplifier 120. The RF amplifier includes a tuner for selecting a specific frequency television signal, and a mixer for converting the broadcast frequency signal to an intermediate frequency (IF) signal. The IF signal is coupled to an IF amplifying circuit 130, which includes one or more IF amplifier stages. The amplified IF signal is coupled to a video detector 140, which develops an amplitude-modulated composite video signal. This video signal is supplied to a video amplifier 4, which produces an amplified composite video signal for AGC circuit 20 and other signal processing circuits (not shown).

Video amplifier 4 provides a composite video signal to an input terminal 12 of AGC circuit 20 by way of a low pass filter comprising a series resistor 6 and a bypass capacitor 8. The composite video signal at terminal 12 is coupled to the base of a transistor 101, which has its collector electrode coupled to a source of reference potential (ground). The composite video signal is coupled to an active filter delay 50, a D.C. threshold noise inverter 30, and an AGC circuit 20 from the emitter of transistor 101. Supply voltage for transistor 101 is provided by a resistor 114, which is coupled from the emitter of transistor 101 to a source of supply voltage (+B).

The D.C. threshold noise inverter produces inverted noise pulses in response to impulse noise in the composite video signal which exceeds a D.C. threshold. The inverted noise pulses are combined with the composite video signal which has been delayed by active filter delay 50, resulting in the cancellation of impulse noise in the composite video signal. The noise-free video signal is coupled to a peak detecting sync separator 40 for the generation of a sync signal. A feedback capacitor 46 couples the video signal at the input of the sync separator 40 to the active filter dela 50 to improve the transition time of the leading edges of the synchronizing signal components of the composite video signal. The active delay 50 and the D.C. threshold noise inverter 30 are described more fully in copending United States patent application, Ser. No. 934829, entitled, "Noise Cancellation circuit," by J. R. Harford, filed concurrently herewith. The peak detecting sync separator 40 is described in further detail in copending United States patent application, Ser. No. 934821, entitled, "Synchronization Signal Separator Circuit," by J. R. Harford, filed concurrently herewith.

The sync signals produced by the sync separator 40 are coupled to a latching circuit 70. The latching circuit 70 also receives horizontal retrace pulses from a keying pulse source 54 which are derived, for example, from a transformer in the horizontal deflection system (not shown). The horizontal retrace pulses are normally in coincidence with the sync signals and are combined by the latching circuit 70 to generate a keying signal for AGC circuit 20 on a conductor 264. When the horizontal retrace pulses are not in coincidence with the sync signals, an out-of-sync signal is coupled to AGC circuit 20 by a conductor 266 in response to the horizontal retrace pulses. The latching circuit 70 is described more fully in copending United States patent application, Ser. No. 934835, entitled, "AGC Keying Signal Circuit," by J. R. Harford, filed concurrently herewith.

The video signal developed at the emitter of transistor 101 is coupled by a resistor 306 to an input amplifier including transistors 302 and 304. The emitter electrode of transistor 302 is coupled to ground by a resistor 308 and its collector electrode is coupled to the base of transistor 304. The collector of transistor 304 is coupled to ground and the emitter of transistor 304 is coupled to the base of transistor 302 and to ground by a resistor 310. Collector voltage for transistor 302 is provided by a transistor 314, which has its collector electrode coupled to the +B supply and its emitter electrode coupled to the collector of transistor 302 by a resistor 312. Bias current for transistor 314 is provided by a resistor 316, which is coupled between the base of transistor 314 and the +B supply, and a resistor 318, which is coupled from the base of transistor 314 to a $V_{be}$ supply 80. The $V_{be}$ supply 80 is described more fully in previously referenced United States patent application, Ser. No. 934829, entitled, "Noise Cancellation Circuit."

An inverted video signal is coupled from the collector of transistor 302 to the base of a transistor 320, which is a dual-emitter transistor connected in an emitter-follower configuration. The collector of transistor 320 is coupled to the +B supply, while one emitter electrode is coupled to the collector of a transistor 328 and the other emitter electrode is coupled to the base of a transistor 328 by a resistor 322. Transistor 328 has its emitter electrode coupled to ground and its base electrode coupled to ground by a forward biased diode 326 and a resistor 324.

The junction between the first emitter of transistor 320 and the collector of transistor 328 is coupled to a peak detector capacitor 330 by a resistor 332. Capacitor 330 is coupled between resistor 332 and ground. Also coupled to the junction of resistor 332 and capacitor 330 is the base of a sampling transistor 370 and the anode of a diode 340. Diode 340 provides a controllable discharge path for capacitor 330 by the series coupling from its cathode electrode of resistors 342, 344, and 346 to ground. Sampling transistor 370 has its collector electrode coupled to ground and its emitter electrode coupled to the base of transistor 372.

The keying pulse on conductor 364 from the latching circuit 70 is coupled to the base electrode of a switching transistor 350 to key the AGC circuit into operation. Transistor 350 has its collector electrode coupled to the +B supply and its emitter electrode coupled to the junction of resistors 342 and 344. The junction of resistors 344 and 346 is coupled to a current mirror at the base electrode of a transistor 352 and the anode electrode of a diode 348. The cathode of diode 348 and the emitter electrode of transistor 352 are coupled to ground. The collector electrode of transistor 352 is coupled to the junction of a resistor 356 and the base of a transistor 360. Resistor 356 is coupled to the cathode of a diode 354, which has its anode electrode coupled to the +B supply.

PNP transistor 360 provides a current source for an AGC filter capacitor 24, and has its emitter electrode coupled to the +B supply by a resistor 362 and its collector electrode coupled to the AGC filter capacitor at terminal 22. Terminal 22 is also coupled to an AGC transfer circuit 400 which couples AGC control voltage to the IF and RF amplifying stages 120 and 130 in the television receiver.

The keying pulse from conductor 264 is also coupled to the emitter of a transistor 372, which has its collector electrode coupled to the junction of resistor 374 and the base of transistor 380. Resistor 374 is coupled to the anode of a diode 376 and conductor 266. The cathode of diode 376 is coupled to ground.

NPN transistor 380 provides a current sink for AGC filter capacitor 24 and the current supplied by current source transistor 360. Transistor 380 has its emitter electrode coupled to ground and its collector electrode coupled to the AGC filter capacitor and the collector of transistor 360 at terminal 22.

In operation, a negative-going video signal including a synchronizing signal component is coupled to the base of inverting input transistor 302 by transistor 101. Transistor 302 is biased to effectively couple only the synchronizing signal component to the base of transistor 320, where it appears as a positive-going signal. A weak video signal or a normal video signal containing primarily white level video information will cause transistor 302 to saturate. As transistor 302 saturates and the voltage on its collector electrode drops to the voltage level of its emitter electrode, base current will be injected into the collector of the transistor and its collector voltage will begin to rise. This over-saturation condition would result in the detection of an incorrect signal level on peak detector capacitor 330. This undesirable operating condition is prevented by transistor 304, which acts to conduct excess current away from the collector of transistor 302 through its base-collector path to ground after transistor 302 has reached its saturation level.

Transistor 314 limits the maximum voltage of the inverted (i.e., positive-going) video signal at the base of transistor 320 to 8 volts. This voltage clamp ensures that the voltage breakdown of peak detector capacitor 330 of 8 volts is not exceeded.

The positive synchronizing signal component at the base of transistor 320 causes that transistor to conduct current through resistor 332 to charge peak detector capacitor 330 to the amplitude of the sync signal components of the video signal. The maximum amplitude of the sync tips is stored on capacitor 330. The keying pulse applied to the base of transistor 350 will turn on transistor 350 to reverse bias diode 340 for the duration of the keying pulse. This prevents discharge of capacitor 330 through diode 340 and resistors 342, 344 and 346 during the keying pulse interval.

It was found that as capacitor 330 charges to the voltage level of the sync pulse at the base of transistor 320, the impedance at the first emitter of transistor 320 increases. The increasing impedance decreases the exponential rate at which capacitor 330 is charged and results in the charging of capacitor 330 to a value below the sync tip for short sync pulses, such as the equalizing pulses. The voltage level stored on capacitor 330 thus becomes a function of sync pulse duration and amplitude, instead of only pulse amplitude. This problem is overcome in the present invention by the operation of transistor 328, which is controlled by the second emitter of transistor 320. As transistor 320 conducts current through its two emitter electrodes, transistor 328 will be driven into conduction by current from the second emitter of transistor 320. The current provided by the first emitter electrode of transistor 320 is thus divided between resistor 332 and the collector of transistor 328 during the charging of capacitor 330. Initially, most of the current provided by transistor 320 flows to capacitor 330 and the impedance of transistor 320 is low. As capacitor 330 is charged toward the sync tip level, it draws less charging current from transistor 320 and the impedance of transistor 320 increases. Transistor 328 will continue to draw approximately the same amount of current throughout the charging interval because its base electrode is driven by the signal at the base of transistor 320, less the base-emitter drop of transistor 320. Thus, transistor 328 acts as a current sink for the duration of the sync pulse, and the current drawn by transistor 328 is effective to limit the increasing impedance of transistor 320 to a level which is substantially lower than the impedance of resistor 332. This low impedance permits capacitor 330 to be rapidly charged to the peak amplitude of the sync pulse, regardless of its duration.

At the termination of the sync pulse, transistors 320 and 328 cease conduction, permitting capacitor 330 to retain a charge level representative of the sync tip until the capacitor is subsequently discharged through diode 340.

Illustratively, when a sync pulse having a 7 volt amplitude is applied to the base of transistor 320, a 6.4 volt level is developed at the emitter electrode of the transistor and applied to resistor 332 and capacitor 330 of the peak detector. Since capacitor 330 is discharged prior to the application of the sync pulse to the peak detector, the initial charging current provided by the first emitter of transistor 320 is 3 milliamps, and the emitter impedance is approximately 12 ohms. As the voltage across capacitor 330 is increased by this charging current, the charging current decreases exponentially and the emitter impedance of transistor 320 increases. By the time capacitor 330 has reached a 6.3 volt level, which is 98.4% of the peak value of 6.4 volts, the charging current has decreased to such an extent that the impedance at the first emitter electrode of transistor 320, neglecting the effect of transistor 328, has risen to approximately 500 ohms. This impedance is significant as compared to the 2000 ohm impedance of resistor 332. But when transistor 328 is taken into consideration, it is seen that the 7 volt sync pulse at the base of transistor 320 causes a one milliampere current to flow through the second emitter electrode of the transistor, which causes transistor 328 to commence conduction. Transistor 328 will conduct a constant one-half milliampere current through its collector-to-emitter path for the duration of the sync pulse. The effect of this current flow is to clamp the impedance of the first emitter electrode of transistor 320 to a maximum value of 50 ohms, which is negligible as compared to the 2000 ohm value of resistor 332, thereby insuring a more linear rate of charge for capacitor 330.

As mentioned previously, the keying pulse from the latching circuit 70 will cause transistor 350 to turn on, reverse-biasing diode 340. Transistor 350 also conducts current to the base of transistor 352, turning that transistor on. The level of the rectified keying signal at the emitter of transistor 350 is determined in part by the voltage level of capacitor 330, as this level is translated up 2 $V_{be}$'s (1.2 volts) by the base-to-emitter junctions of transistors 370 and 372, and down one $V_{be}$ by the base-to-emitter junction of transistor 350. The current conducted to the base of transistor 352 is thus a function of the sync tip level voltage stored on capacitor 330.

The conduction of transistor 352 causes transistor 360 to conduct, thereby supplying charging current to the AGC filter capacitor 24. Some or all of the charging current conducted by transistor 360 will be conducted away from the AGC filter capacitor by current sink transistor 380, as discussed below.

The keying pulse supplied by the latching circuit 70 also provides a source of emitter current for transistor 372. The base of transistor 372 is coupled to the emitter of transistor 370 which provides a signal determined by the voltage level stored on peak detector capacitor 330. Transistor 370 is coupled between capacitor 330 and the base of transistor 372 because transistor 372 is a low beta transistor which requires a relatively large base current. Transistor 370 is a high beta transistor requiring a relatively small base current, which does not adversely affect the charge stored on capacitor 330.

The current flow through the emitter-to-collector path of transistor 372 is coupled to the base of current sink transistor 380, causing this transistor to conduct. Current sink transistor 380 acts to discharge the AGC filter capacitor 24 toward ground under weak signal conditions when the gain of the receiver is to be increased. Under these signal conditions, current source transistor 360 supplies less charging current than is conducted by current sink transistor 380, resulting in a net discharge of AGC filter capacitor 24. Under strong signal conditions, current source transistor 360 supplies more current than current sink transistor 380 conducts, resulting in a net charging of AGC filter capacitor 24. When the sync tip of the video signal is at the proper voltage level and no AGC gain correction is required, the current supplied by current source transistor 360 precisely matches the current conducted by current sink transistor 380, resulting in no net change of the voltage level on the AGC filter capacitor. These matched source and sink currents will be of the same magnitude, regardless of the level of the voltage on the AGC filter capacitor 24.

When the latching circuit 70 is not keying AGC circuit 20 into operation between keying intervals, transistor 320 will still operate in response to impulse noise by attempting to charge capacitor 330 to the maximum amplitude of the noise pulses. Peak detector capacitor 330 will not retain an appreciable charge at this time, however, because diode 340 remains forward biased when transistor 350 is not conducting and continually discharges capacitor 330 to ground through resistors 342, 344 and 346. This discharge path prevents the retention of impulse noise pulses on capacitor 330 during video trace intervals, which would otherwise cause AGC circuit 20 to falsely set up in response to this retained charge during the succeeding keying interval. The discharge path thus obviates the need for complex noise protection circuits in AGC circuit 20.

While the present invention has been illustrated in the environment of automatic gain control circuits, it is to be understood that the teachings of the invention may be equally applicable in other embodiments, such as peak detecting circuits for digital voltmeters.

What is claimed is:

1. A peak detector circuit for detecting the maximum excursion of an amplitude varying signal, comprising:
    a network including a capacitor and a charging impedance serially coupled and having a time constant suitable for responding to the maximum excursion of an amplitude varying signal;
    semiconductor means having an input terminal for receiving said amplitude varying signal and an output terminal coupled to said charging impedance for charging said capacitor toward the maximum excursion of said amplitude varying signal, said means exhibiting an impedance which is subject to increase with a decrease in current drawn therethrough; and
    a controllable current sink responsive to the amplitude varying signal at the input terminal of said semiconductor means and coupled to the output terminal of said semiconductor means for drawing a component of current through said semiconductor means during the charging of said capacitor which is supplemental to the capacitor charging current drawn therethrough, said supplemental current component being of sufficient magnitude to preclude increase of the impedance exhibited by said semiconductor means during the charging of said capacitor beyond a value which is substantially less than said charging impedance.

2. A peak detecting sample and hold circuit for detecting the maximum excursion of an amplitude varying signal, comprising:
    a network including a capacitor serially coupled to a charging impedance and having a time constant suitable for responding to the maximum excursion of an amplitude varying signal;
    semiconductor means having an input terminal for receiving said amplitude varying signal and an output terminal coupled to said charging impedance for charging said capacitor toward the maximum excursion of said amplitude varying signal; and
    a controllable current sink responsive to the amplitude varying signal at the input terminal of said semiconductor means and coupled to the output terminal of said semiconductor means for drawing a component of current through said semiconductor means during the charging of said capacitor which is supplemental to the capacitor charging current drawn therethrough and drawing no current when said semiconductor means is not charging said capacitor.

3. In a television automatic gain control circuit for developing an automatic gain control voltage, a peak detector circuit for detecting the peaks of the synchronizing signal components of a composite video signal having synchronizing signal components of different time duration comprising:
    a network including a capacitor serially coupled to a charging impedance and having a time constant suitable for responding to the peak amplitudes of said synchronizing signal components;
    semiconductor means having an input for receiving said composite video signal and an output coupled to said charging impedance for charging said capacitor toward the peaks of said synchronizing signal components, said semiconductor means exhibiting an impedance which is subject to increase with a decrease in current drawn therethrough;
    a controllable current sink responsive to the composite video signal at the input of said semiconductor means and coupled to the output of said semiconductor means for drawing a component of current through said semiconductor means during the charging of said capacitor which is supplemental to the capacitor charging current drawn therethrough, said supplemental current component being of sufficient magnitude to preclude increase of the impedance exhibited by said semiconductor means during charging of said capacitor beyond a value which is substantially less than said charging impedance; and
    means, independent of said controllable current sink, for discharging said capacitor.

4. The television automatic gain control circuit of claim 3, further comprising:
    a source of recurrent pulses normally in time coincidence with said synchronizing signal components and having a constant time duration which is longer than the shortest duration ones of said synchronizing signal components; and
    means responsive to said recurrent pulses and coupled to said capacitor for developing an automatic gain control voltage which varies as a function of the peaks of said synchronizing signal components; and wherein said controllable current sink conducts no current when said semiconductor means is not charging said capacitor.

5. The peak detector circuit of claim 4, wherein said means for discharging said capacitor is coupled to said recurrent pulse source for discharging said capacitor between the occurrences of said recurrent pulses.

6. In a television automatic gain control circuit, a peak detector circuit for detecting the peaks of the synchronizing signal components of a composite video signal comprising:

a source of composite video signals having synchronizing signal components;

a network including a capacitor serially coupled to a charging impedance and having a time constant suitable for responding to the peaks of said synchronizing signal components;

a first transistor having an input electrode coupled to said source of composite video signals and an output electrode coupled to said charging impedance for charging said capacitor toward the peaks of said synchronizing signal components, said first transistor exhibiting an output impedance which is subject to increase with a decrease in current drawn therethrough; and a second transistor responsive to the signals which are coupled to the input electrode of said first transistor and having an output electrode coupled to the output electrode of said first transistor for drawing a component of current through said first transistor during the charging of said capacitor which is supplemental to the capacitor charging current drawn therethrough, said supplemental current component being of sufficient magnitude to preclude increase of the output impedance exhibited by said first transistor during the charging of said capacitor beyond a value which is substantially less than said charging impedance.

7. In a television automatic gain control circuit, a peak detector circuit for detecting the peaks of the synchronizing signal components of a composite video signal comprising:

a source of composite video signals having synchronizing signal components;

a network including a capacitor serially coupled to a resistor and having a time constant suitable for responding to the peaks of said synchronizing signal components;

a first transistor having a base electrode coupled to said source of composite video signals, a first emitter electrode coupled to said resistor and a second emitter electrode; and a second transistor having a base electrode coupled to said second emitter electrode of said first transistor, and a collector electrode coupled to the first emitter electrode of said first transistor, wherein said first transistor is responsive to said synchronizing signal components for charging said capacitor and causing said second transistor to conduct current.

* * * * *